(12) United States Patent
Lim

(10) Patent No.: US 7,728,428 B2
(45) Date of Patent: Jun. 1, 2010

(54) MULTILAYER PRINTED CIRCUIT BOARD

(75) Inventor: Jeong-pil Lim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1190 days.

(21) Appl. No.: 11/316,835

(22) Filed: Dec. 27, 2005

(65) Prior Publication Data
US 2006/0151205 A1    Jul. 13, 2006

(30) Foreign Application Priority Data
Jan. 12, 2005    (KR) ............... 10-2005-0002997

(51) Int. Cl.
H01L 23/34    (2006.01)
H01L 23/053    (2006.01)
(52) U.S. Cl. ............ 257/724; 257/700; 257/698; 257/774; 257/E23.144
(58) Field of Classification Search ............ 257/700, 257/698, 724, 774
See application file for complete search history.

(56) References Cited

U.S. PATENT DOCUMENTS

| | | | | |
|---|---|---|---|---|
| 5,603,847 | A | * | 2/1997 | Howard et al. ............ 216/17 |
| 5,623,160 | A | * | 4/1997 | Liberkowski ............ 257/621 |
| 6,084,779 | A | * | 7/2000 | Fang ............ 361/763 |
| 6,252,177 | B1 | | 6/2001 | Stoddard |
| 6,337,798 | B1 | | 1/2002 | Hailey et al. |
| 6,483,714 | B1 | * | 11/2002 | Kabumoto et al. ............ 361/760 |
| 6,535,398 | B1 | * | 3/2003 | Moresco ............ 361/792 |
| 6,691,296 | B1 | | 2/2004 | Nakayama et al. |
| 6,706,974 | B2 | | 3/2004 | Chen et al. |
| 6,713,860 | B2 | * | 3/2004 | Li ............ 257/700 |
| 6,747,356 | B2 | * | 6/2004 | Ando et al. ............ 257/758 |
| 2002/0100612 | A1 | | 8/2002 | Crockett et al. |
| 2003/0136580 | A1 | | 7/2003 | Chen et al. |
| 2005/0082088 | A1 | | 4/2005 | Roth et al. |
| 2005/0108671 | A1 | | 5/2005 | Becker et al. |
| 2005/0225955 | A1 | | 10/2005 | Grebenkemper et al. |

FOREIGN PATENT DOCUMENTS

| | | |
|---|---|---|
| CN | 1534698 | 10/2004 |
| KR | 64-14993 | 1/1989 |
| KR | 2000-156548 | 6/2000 |
| WO | WO 2004/111890 | 12/2004 |

OTHER PUBLICATIONS

European Search Report dated Jan. 23, 2008 issued in EP06100120.2.
Chinese Letters Patent issued Jul. 1, 2009 in CN Application No. 200610004970.4.

* cited by examiner

*Primary Examiner*—Nitin Parekh
(74) *Attorney, Agent, or Firm*—Stanzione & Kim, LLP

(57) ABSTRACT

A multilayer PCB includes a plurality of signal layers, a ground layer and a power layer disposed between the plurality of signal layers, a signal via extending through the plurality of signal layers to allow a signal current to flow therethrough, at least one stitching capacitor provided in one of the plurality of signal layers to allow a return current that corresponds to the signal current to flow between the power layer and the ground layer. Thus, the multiplayer PCB can form a path of a return current that minimizes generation of EMI when a signal current is generated.

24 Claims, 5 Drawing Sheets

MULTILAYER PRINTED CIRCUIT BOARD

CROSS-REFERENCE TO RELATED APPLICATIONS

This application claims the benefit under 35 U.S.C. §119 of Korean Patent Application No. 2005-2997, filed on Jan. 12, 2005, in the Korean Intellectual Property Office, the disclosure of which is incorporated herein in its entirety by reference.

BACKGROUND OF THE INVENTION

1. Field of the Invention

The present general inventive concept relates to a multilayer printed circuit board (PCB), and more particularly, to a multilayer PCB having a stitching capacitor.

2. Description of the Related Art

A multi-layer PCB comprises a plurality of chips and electronic components, a plurality of signal layers communicating with each other through a signal current, and a ground layer and a power layer through which a return current corresponding to the signal current flows. One or more openings (not shown) are disposed in each layer of the multilayer PCB. A via is disposed at the one or more openings to electrically connect to each layer.

FIG. 1 is a perspective view illustrating a conventional multilayer PCB, and FIG. 2 is a plane view illustrating the conventional multiplayer PCB of FIG. 1.

Referring to FIG. 1, the conventional multilayer PCB comprises a first signal layer 10, which is the uppermost layer of the PCB, and a second signal layer 40, which is the lowermost layer of the PCB. A ground layer 20 and a power layer 30 are disposed between the first signal layer 10 and the second signal layer 40. A signal via 50 is formed between the first signal layer 10 and the second signal layer 40 to pass a signal current 1 therebetween.

In this case, a signal transmitted to a target chip (not shown) disposed at the second signal layer 40 from a source chip (not shown) disposed at the first signal layer 10 is represented by the signal current 1 illustrated by a solid line in FIG. 1.

In addition, a return current 2 is generated according to the signal current 1. The signal current 1 and the return current 2 form a current loop together. As illustrated in FIG. 1, the return current 2 flows through a path that can have a minimal impedance, since the return current 2 flows through the shortest possible path (i.e., between the power layer 30 and the ground layer 20 adjacent to the signal current 1). The return current 2 may flow through a grounded guard covering the signal current 1 at the first signal layer 10 and the second signal layer 40, which is a path extending directly through the ground layer 20 and the power layer 30 that are used as a reference surface.

Alternatively, a return current 3 can flow through a decoupling capacitor 60 from the power layer 30 to the ground layer 20. However, in this case the impedance that corresponds to the return current 3 is greater than when the return current 2 is allowed to flow directly through the reference surface (i.e., the shortest path).

Thus, the conventional multilayer PCB provides a path of the return current 3 through the reference surface using a plurality of decoupling capacitors 60 disposed all over the PCB. The decoupling capacitor 60 is formed at the first signal layer 10 and includes a power via 61 connected to the power layer 30 and a ground via 62 connected to the ground layer 20.

Referring to FIGS. 1 and 2, the decoupling capacitors 60 allow the return current 3 to form a current loop by returning from the power layer 30, which is used as the reference surface of the second signal layer 40, to the ground layer 20, which is used as the reference surface of the first signal layer 10, by passing through the power via 61 and the ground via 62 of the decoupling capacitors 60.

However, as illustrated in FIG. 2, a loop area (A) formed by the signal current 1 and the return current 3 increases. The increase in the loop area (A) causes an increase in electromagnetic interference (EMI), having a negative effect on nearby electronic components. The increase in EMI may prevent the PCB from functioning properly when the signal current 1, which is transferred between the first and second signal layers 10 and 40, is controlled by a frequency value.

SUMMARY OF THE INVENTION

The present general inventive concept provides a multiplayer PCB that can form a path of a return current that minimizes generation of EMI when a signal current is generated.

Additional aspects of the present general inventive concept will be set forth in part in the description which follows and, in part, will be obvious from the description, or may be learned by practice of the present general inventive concept.

The foregoing and/or other aspects of the present general inventive concept are achieved by providing a multilayer PCB comprising a plurality of signal layers, a ground layer and a power layer disposed between the plurality of signal layers, a signal via extending through the plurality of signal layers to allow a signal current to flow therethrough, and at least one stitching capacitor provided in one of the plurality of signal layers to allow a return current that corresponds to the signal current to flow between the power layer and the ground layer.

The at least one stitching capacitor may be positioned to minimize a loop area formed by a current loop that is generated by the signal current and the return current.

The at least one stitching capacitor may be positioned to minimize a horizontal distance between the signal via and the at least one stitching capacitor.

The at least one stitching capacitor may comprise a ground via electrically connected to the ground layer and a power via electrically connected to the power layer, and the at least one stitching capacitor may be disposed at a position having a first horizontal distance between the power via and the signal via that is equal to a second horizontal distance between the power via and the ground via.

The at least one stitching capacitor may be disposed at a position such that a path connecting the power via to the ground via is parallel to the signal current on the one of the plurality of signal layers having the at least one stitching capacitor provided therein.

The at least one stitching capacitor may be disposed at a position such that a horizontal position of the power via overlaps with a path of the signal current flowing on another signal layer electrically connected to the signal layer having the at least one stitching capacitor provided therein.

The at least one stitching capacitor may comprise a plurality of stitching capacitors symmetrically arranged with respect to the signal via.

The foregoing and/or other aspects of the present general inventive concept are also achieved by providing a multilayer PCB, comprising at least two signal layers and at least two voltage layers, a signal current path to flow directly through the at least two voltage layers from a source component to a target component, and a return current path to flow through at least one voltage layer such that the return current path is substantially aligned with the signal current path on different ones of the signal and voltage layers.

The at least two signal layers may comprise a first signal layer having the source component thereon and a second signal layer having the target component thereon, and the at least two voltage layers may comprise at least one power layer disposed between the first and second signal layers, and at least one ground layer may be disposed between the first and second signal layers.

The multilayer PCB may further comprise a signal via to connect a first signal layer having the source component and a second signal layer having the target component, and a stitching capacitor disposed on the first signal layer adjacent to the signal via and having a first via to connect the first signal layer with a first voltage layer disposed between the first signal layer and the second signal layer and a second via to connect the first signal layer with a second voltage layer disposed between the first signal layer and the second signal layer.

Electromagnetic interference generated between the signal current path and the return current path may be minimized by positioning the stitching capacitor close to the signal via.

The foregoing and/or other aspects of the present general inventive concept are also achieved by providing a multilayer PCB, comprising a plurality of layers including at least two electronic component layers and at least two reference planes, a signal via to connect the at least two electronic component layers, and at least two reference vias disposed adjacent to one another to connect one of the at least two electronic component layers with each of the at least two reference planes such that a distance between the signal via and the at least two reference vias is minimized.

The at least two reference vias may comprise at least one stitching capacitor to hold a charge that is equal to a voltage difference between the at least two reference planes.

The at least two reference planes may comprise at least two voltage layers each having a different predetermined voltage.

The at least two reference planes may include a power plane and a ground plane and may be disposed between the at least two electronic component layers to provide power and ground thereto.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
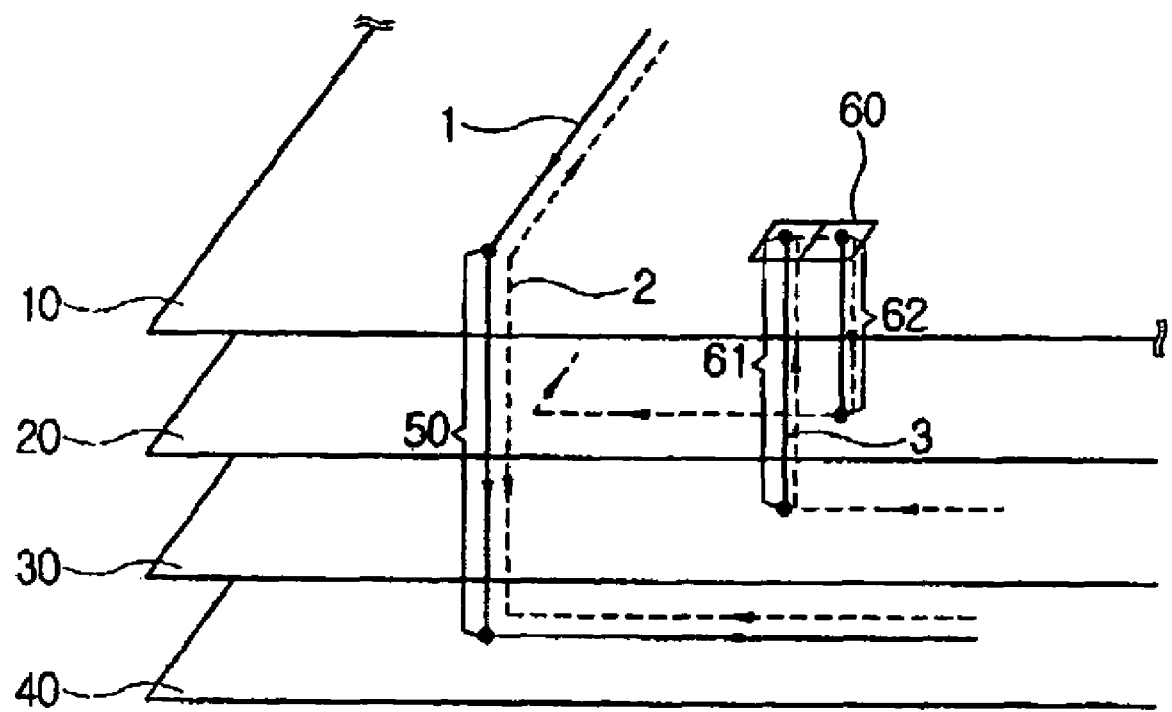
FIG. 1 is a perspective view illustrating a conventional multilayer PCB.

Reference will now be made in detail to the embodiments of the present general inventive concept, examples of which are illustrated in the accompanying drawings, wherein like reference numerals refer to like elements throughout. The embodiments are described in order to explain the present general inventive concept while referring to the figures.

Figure 3:
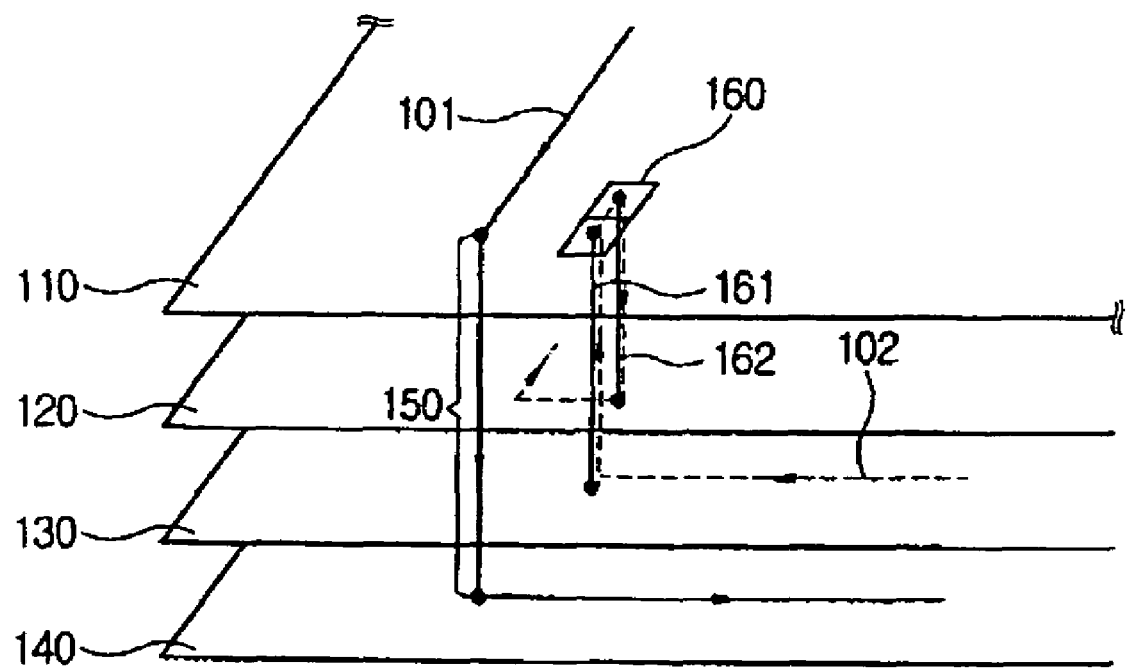
FIG. 3 is a perspective view illustrating a multilayer PCB according to an embodiment of the present general inventive concept.

FIG. 3 is a perspective view illustrating a multilayer PCB according to an embodiment of the present general inventive concept.

Referring to FIG. 3, the multilayer PCB comprises a first signal layer 110 provided as an uppermost layer of the multilayer PCB and a second signal layer 140 provided as a lowermost layer of the multilayer PCB. A ground layer 120 and a power layer 130 are disposed between the first signal layer 110 and the second signal layer 140. A signal via 150 is formed between the first signal layer 110 and the second signal layer 140 through which a signal current 101 passes. Additionally, a stitching capacitor 160 is formed adjacent to the signal via 150 on the first signal layer 110.

The stitching capacitor 160 comprises a power via 161 connected to the power layer 130 and a ground via 162 connected to the ground layer 120.

Figure 4:
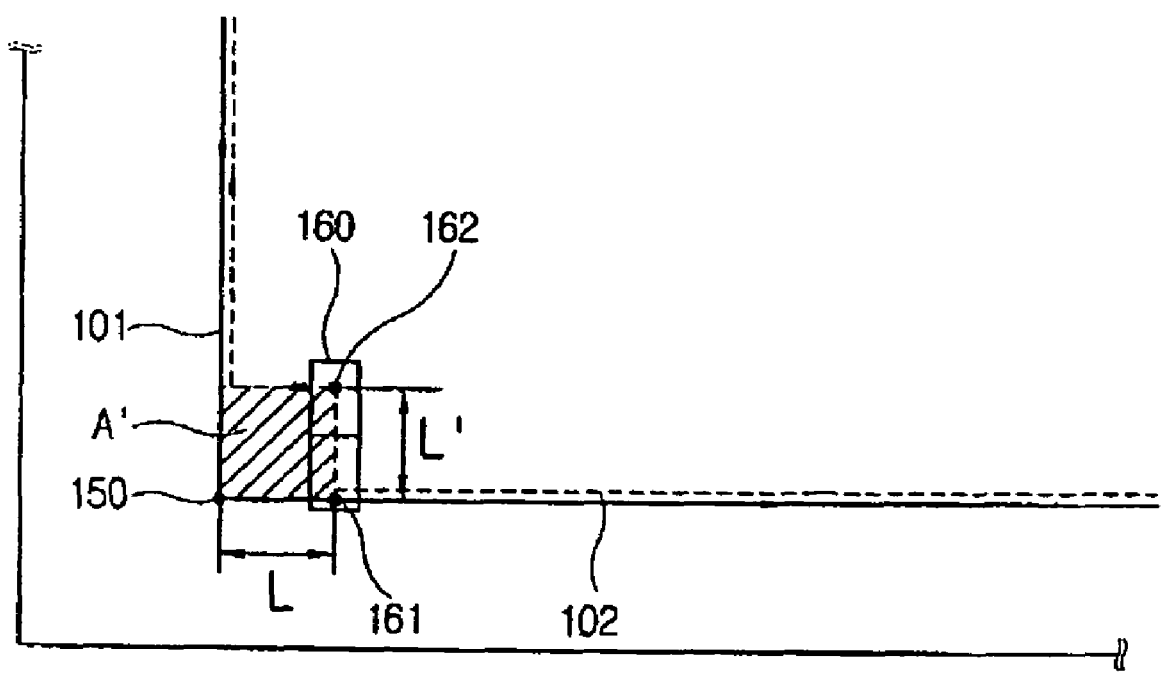
FIG. 4 is a plane view illustrating the multilayer PCB of FIG. 3.

FIG. 4 is a plane view illustrating the multilayer PCB of FIG. 3.

Referring to FIG. 4, a horizontal position of the power via 161 may overlap with the signal current 101 that flows on the second signal layer 140 (see FIG. 3).

Additionally, the stitching capacitor 160 is disposed to be parallel with the signal current 101 that flows on the first signal layer 10 (see FIG. 3). As illustrated in FIG. 4, the stitching capacitor 160 is disposed at a position such that the signal current 101 flows parallel to a line (path) connecting the power via 161 with the ground via 162.

Furthermore, the stitching capacitor 160 is disposed at a position such that a first horizontal distance (L) between the power via 161 and the signal via 150 is equal to a second horizontal distance (L') between the power via 161 and the ground via 162.

According to the present embodiment, a signal transmitted from a source chip (not shown) disposed at the first signal layer 110 to a target chip (not shown) disposed at the second signal layer 140 is represented by the signal current 101 illustrated by a solid line in FIG. 3.

In addition, a return current 102 originates at the power layer 130, which is used as a references surface of the second signal layer 140, and flows into the stitching capacitor 160 through the power via 161 and then flows to the ground layer 120 through the ground via 162. Referring to FIG. 4, the return current 102 overlaps (i.e., is aligned) with the signal current 101 with the exception of a predetermined portion. The return current 102 is not aligned (i.e., does not overlap) with the signal current 101 at a portion of the multilayer PCB that is adjacent to the signal via 150. In other words, as illustrated in FIG. 4, the predetermined portion at which the signal current 101 and the return current 102 are not aligned corresponds to an area in between the stitching capacitor 160 and the signal via 150.

Figure 2:
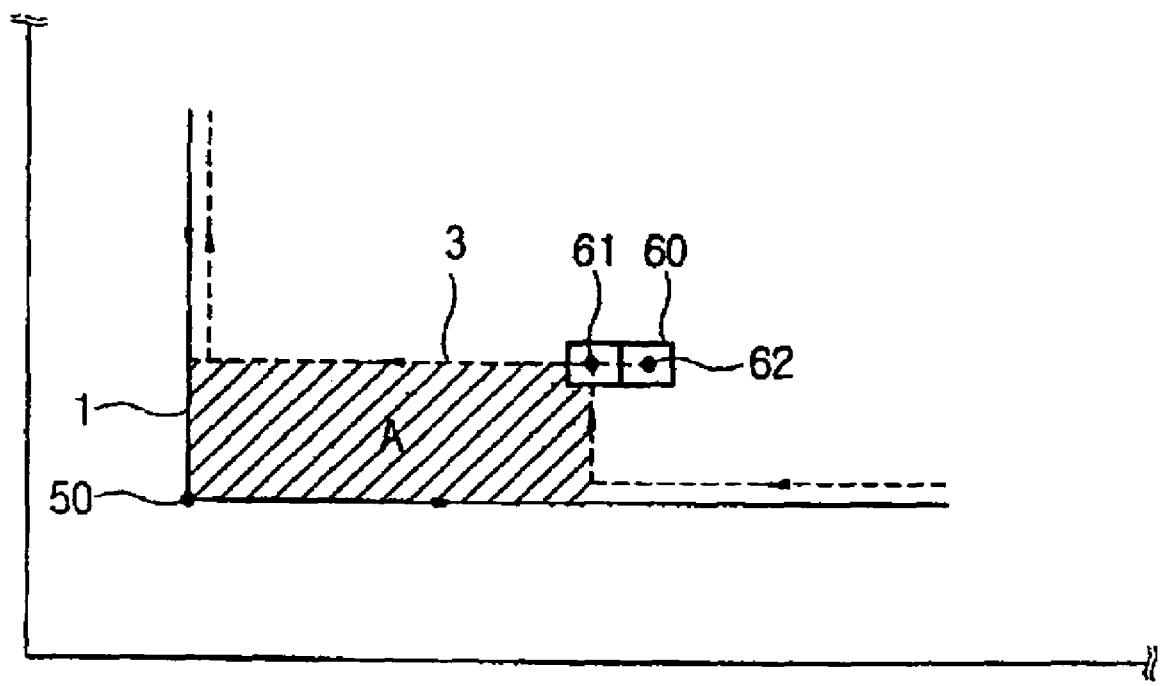
FIG. 2 is a plane view illustrating the conventional multilayer PCB of FIG. 1.

The predetermined portion formed adjacent to the signal via 150 corresponds to a loop area (A'), which creates some EMI. Here, the loop area (A') is substantially reduced compared to the loop area (A) of the conventional multiplayer PCB illustrated in FIG. 2.

Further, referring to FIG. 4, the size of the loop area (A') is determined by the second horizontal distance (L') between the power via 161 and the ground via 162. As the size of the stitching capacitor 160 is decreased, the loop area (A') is also decreased according to the size of the stitching capacitor 160. Additionally, the first horizontal distance (L) can be equal to the second horizontal distance (L').

Figure 5:
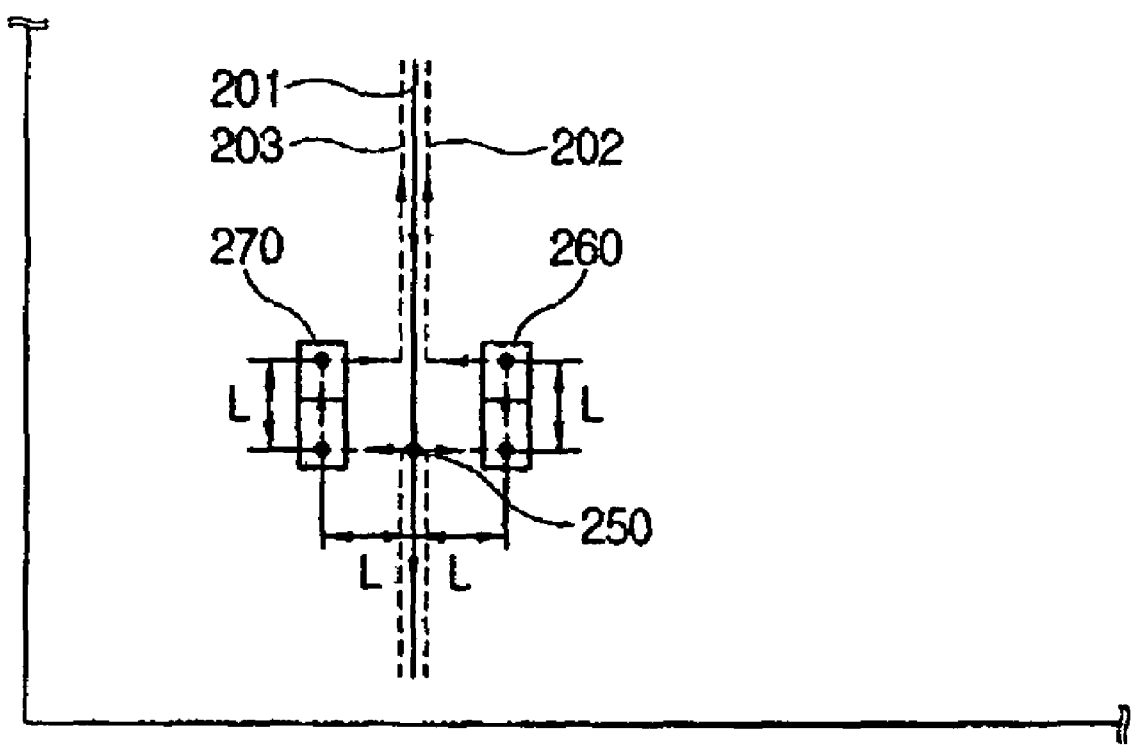
FIG. 5 is a plane view illustrating a multilayer PCB according to another embodiment of the present general inventive concept.

FIG. 5 is a plane view illustrating multilayer PCB according to another embodiment of the present general inventive concept.

Referring to FIG. 5, the multilayer PCB includes a first stitching capacitor 260 and a second stitching capacitor 270 disposed symmetrically with respect to a signal via 250. In this case, a first return current 202 and a second return current 203 can selectively flow through the first stitching capacitor 260 on the right side of the signal via 250 or through the second stitching capacitor 270 on the left side of the signal via 250 when a signal current 201 flows through the signal via 250.

Alternatively, a stitching capacitor may be formed on a second signal layer of a multilayer PCB. The stitching capacitor may be disposed adjacent to a signal via while a second horizontal distance between a ground via and a power via can be different from a first horizontal distance between the signal via and the stitching capacitor. Further, the stitching capacitor can include any number of stitching capacitors disposed adjacent to the signal via. Although the various embodiments of the general inventive concept describe a first signal layer, a second signal layer, a power layer, and a ground layer, it should be understood that other layers may also be used. For example, a third signal layer may be added. In another example, two different voltage layers (e.g., 5V and −5V) may be used instead of the power layer and the ground layer.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A multilayer PCB, comprising:
   a plurality of signal layers;
   a ground layer and a power layer disposed between the plurality of signal layers;
   a signal via extending through the plurality of signal layers to allow a signal current to flow therethrough; and
   at least one stitching capacitor provided in one of the plurality of signal layers to allow a return current that corresponds to the signal current to flow between the power layer and the ground layer, the at least one stitching capacitor having a length that is equal to a distance between the at least one stitching capacitor and the signal via, the length of the at least one stitching capacitor being perpendicular to the distance between the at least one stitching capacitor and the signal via,
   wherein the at least one stitching capacitor includes a ground via electrically connected to the ground layer and a power via electrically connected to the power layer, and the at least one stitching capacitor is disposed such that the power via is arranged in a position that overlaps a path of the signal current flowing on another signal layer that is electrically connected to the signal layer having the at least one stitching capacitor provided therein.

2. The multilayer PCB according to claim 1, wherein the at least one stitching capacitor, the signal current, and the return current form a current loop that is positioned adjacent to the signal via, and the length of the at least one stitching capacitor is arranged parallel with a direction along which the signal current is received into the signal via.

3. The multilayer PCB according to claim 2, further comprising:
   a loop area having a square defined by the length of the at least one stitching capacitor.

4. The multilayer PCB according to claim 3, wherein the at least one stitching capacitor is disposed at a position having a first distance between the power via and the signal via that is equal to a second distance between the power via and the ground via, the first distance being perpendicular to the second distance.

5. The multilayer PCB according to claim 4, wherein the at least one stitching capacitor is disposed at a position such that a path connecting the power via to the ground via is parallel to the signal current on the one of the plurality of signal layers having the at least one stitching capacitor provided therein.

6. The multilayer PCB according to claim 4, wherein the at least one stitching capacitor comprises a plurality of stitching capacitors arranged symmetrically with respect to the signal via.

7. The multilayer PCB according to claim 6, wherein the at least one stitching capacitor comprises a plurality of stitching capacitors that are arranged symmetrically with respect to the signal via.

8. The multilayer PCB according to claim 1, wherein the at least one stitching capacitor is positioned to minimize the distance between the signal via and the at least one stitching capacitor.

9. The multilayer PCB according to claim 8, wherein the at least one stitching capacitor is disposed at a position including a first distance between the power via and the signal via that is equal to a second distance between the power via and the ground via.

10. The multilayer PCB according to claim 9, wherein the at least one stitching capacitor is disposed at a position such that a path connecting the power via to the ground via is parallel with the signal current on the one of the plurality of signal layers having the at least one stitching capacitor provided therein.

11. A multilayer PCB, comprising:
    at least two signal layers and at least two voltage layers;
    a signal current path to flow directly through the at least two voltage layers from a source component to a target component;
    a return current path to flow through at least one voltage layer such that the return current path is substantially aligned with the signal current path on different ones of the signal and voltage layers;
    a signal via to connect a first signal layer having the source component and a second signal layer having the target component; and
    a stitching capacitor disposed on the first signal layer adjacent to the signal via and having a first via to connect the first signal layer with a first voltage layer disposed between the first signal layer and the second signal layer and a second via to connect the first signal layer with a second voltage layer disposed between the first signal layer and the second signal layer,
    wherein the stitching capacitor is disposed such that a horizontal position of the first via overlaps the signal current path on the second signal layer.

12. The multilayer PCB according to claim 11, wherein the at least two signal layers comprise a first signal layer having the source component thereon and a second signal layer having the target component thereon, and the at least two voltage layers comprise at least one power layer disposed between the first and second signal layers, and at least one ground layer disposed between the first and second signal layers.

13. The multilayer PCB according to claim 11, wherein electromagnetic interference generated between the signal current path and the return current path is minimized by positioning the stitching capacitor adjacent to the signal via.

14. A multilayer PCB, comprising:
a plurality of layers including at least two electronic component layers and at least two reference planes;
a signal via to connect the at least two electronic component layers; and
at least two reference vias disposed adjacent to one another to connect one of the at least two electronic component layers with each of the at least two reference planes such that a distance between the signal via and one reference via among the at least two reference vias is less than or equal to a distance between the at least two reference vias,
wherein a horizontal position of any one of the at least two reference vias overlaps a path of a signal current flowing on another electronic component layer that is electronically connected to the electronic component layer having the at least two reference vias provided therein.

15. The multilayer PCB according to claim 14, wherein the at least two reference vias comprise at least one stitching capacitor to hold a charge that is equal to a voltage difference between the at least two reference planes.

16. The multilayer PCB according to claim 14, wherein the at least two reference planes comprise at least two voltage layers each having a different predetermined voltage.

17. The multilayer PCB according to claim 14, wherein the at least two reference planes include a power plane and a ground plane and are disposed between the at least two electronic component layers to provide power and ground thereto.

18. The multilayer PCB of claim 14, further comprising:
a signal current path to flow through the at least two electronic component layers; and
a return current path to flow through at least one of the at least two reference planes such that the return current path is aligned with the signal current path on different ones of the at least two electronic component layers and the at least two reference planes.

19. A multilayer PCB, comprising:
a plurality of signal layers;
a plurality of reference layers disposed between the plurality of signal layers;
at least one signal via extending through the plurality of signal layers; and
at least one capacitor provided in one of the plurality of signal layers, and having a length that is greater than or equal to a distance between the at least one capacitor and the at least one signal via, the at least one capacitor having a reference via that overlaps a path of a signal current that flows between the signal layers.

20. The multilayer PCB of claim 19, further comprising:
a signal current path to flow through the plurality of signal layers; and
a return current path to flow through at least one of the plurality of reference layers such that the return current path is aligned with the signal current path on different ones of the plurality of signal layers and the plurality of reference layers.

21. A multilayer PCB, comprising:
a plurality of signal layers and reference layers;
at least two capacitors disposed parallel to one another on one of the plurality of signal layers;
at least one signal via extending through the plurality of signal layers such that the at least one signal via is equidistant from each of the at least two capacitor, the at least one capacitor having a reference via that overlaps a path of a signal current that flows between the signal layers.

22. The multilayer PCB of claim 21, wherein a length of each of the at least two capacitors is greater than or equal to a distance between the at least one signal via and the at least two capacitors.

23. The multilayer PCB of claim 21, further comprising:
a signal current path to flow through the plurality of signal layers; and
a return current path to flow through at least one of the plurality of reference layers such that the return current path is aligned with the signal current path on different ones of the plurality of signal layers and the plurality of reference layers.

24. The multilayer PCB of claim 1, wherein the flow of the signal current is aligned with the flow of the return current.

* * * * *